(12) United States Patent
Yen (10) Patent No.: US 10,818,208 B2
(45) Date of Patent: Oct. 27, 2020

(54) SOURCE DRIVER

(71) Applicant: Novatek Microelectronics Corp., Hsinchu (TW)

(72) Inventor: Yu-Jen Yen, Tainan (TW)

(73) Assignee: Novatek Microelectronics Corp., Hsinchu (TW)

( * ) Notice: Subject to any disclaimer, the term of this patent is extended or adjusted under 35 U.S.C. 154(b) by 141 days.

(21) Appl. No.: 16/131,040

(22) Filed: Sep. 14, 2018

(65) Prior Publication Data
US 2020/0090563 A1 Mar. 19, 2020

(51) Int. Cl.
*G09G 3/00* (2006.01)
*G01R 31/30* (2006.01)

(52) U.S. Cl.
CPC ......... *G09G 3/006* (2013.01); *G01R 31/3004* (2013.01); *G09G 2330/12* (2013.01)

(58) Field of Classification Search
CPC ............... G09G 2330/12; G09G 3/006; G01R 31/3004–3012
See application file for complete search history.

(56) References Cited

U.S. PATENT DOCUMENTS

| | | | | |
|---|---|---|---|---|
| 6,265,889 B1* | 7/2001 | Tomita | ................... | G09G 3/006 324/760.02 |
| 7,180,355 B2* | 2/2007 | Teraishi | ................. | G09G 3/006 326/68 |
| 7,199,575 B2* | 4/2007 | Chen | ..................... | G09G 3/006 324/750.3 |
| 7,525,335 B2* | 4/2009 | Ootaguro | .............. | G02F 1/1362 324/760.01 |
| 8,810,268 B2* | 8/2014 | Huang | ................... | G09G 3/006 324/750.3 |
| 9,530,338 B2* | 12/2016 | Huang | ................... | G09G 3/006 |
| 9,697,771 B2* | 7/2017 | Azizi | .................... | G09G 3/3696 |
| 2003/0098859 A1* | 5/2003 | Udo | ........................ | G09G 3/006 345/204 |
| 2004/0119824 A1* | 6/2004 | Osada | ..................... | G09G 3/006 348/180 |
| 2004/0246757 A1* | 12/2004 | Miyagawa | ............. | G09G 3/006 365/63 |
| 2005/0057273 A1* | 3/2005 | Lin | ........................ | G09G 3/006 324/760.01 |
| 2005/0270059 A1* | 12/2005 | Ando | ..................... | G09G 3/006 324/760.01 |

(Continued)

*Primary Examiner* — Patrick Assouad
*Assistant Examiner* — Demetrius R Pretlow
(74) *Attorney, Agent, or Firm* — JCIPRNET (57) ABSTRACT

A source driver includes a first output pad, a second output pad, a first charge-sharing path, a second charge-sharing path, a first charge-sharing switch, a second charge-sharing switch and a test circuit. A first terminal and a second terminal of the first charge-sharing switch are respectively coupled to the first output pad and the first charge-sharing path. A first terminal and a second terminal of the second charge-sharing switch are respectively coupled to the second output pad and the second charge-sharing path. The test circuit is coupled to the first charge-sharing path and the second charge-sharing path. The test circuit performs a test for the first output pad and the second output pad via the first charge-sharing path, the second charge-sharing path, the first charge-sharing switch and the second charge-sharing switch in a test period.

11 Claims, 4 Drawing Sheets

(56) References Cited

U.S. PATENT DOCUMENTS

| | | | |
|---|---|---|---|
| 2007/0126618 A1* | 6/2007 | Tanaka | G09G 3/3688 341/155 |
| 2007/0132702 A1* | 6/2007 | Kajihara | G09G 3/3688 345/100 |
| 2008/0007504 A1* | 1/2008 | Kawaura | G09G 3/006 345/89 |
| 2008/0211835 A1* | 9/2008 | Enjou | G09G 3/3685 345/690 |
| 2010/0103155 A1* | 4/2010 | Nishimura | G09G 3/20 345/211 |
| 2010/0141293 A1* | 6/2010 | Chen | G09G 3/006 324/760.01 |
| 2010/0271406 A1* | 10/2010 | Tazuke | G09G 3/006 345/690 |
| 2012/0146976 A1* | 6/2012 | Lee | G09G 3/3688 345/211 |
| 2012/0169368 A1* | 7/2012 | Chen | G09G 3/006 324/764.01 |
| 2012/0299978 A1* | 11/2012 | Chaji | G09G 3/006 345/690 |
| 2012/0306826 A1* | 12/2012 | Tsuchi | G09G 3/006 345/204 |
| 2013/0314394 A1* | 11/2013 | Chaji | G09G 1/002 345/212 |
| 2014/0043314 A1* | 2/2014 | Park | G09G 3/20 345/212 |
| 2015/0379940 A1* | 12/2015 | Kishi | G09G 3/3225 345/690 |
| 2016/0027382 A1* | 1/2016 | Chaji | G09G 3/006 345/212 |
| 2016/0055791 A1* | 2/2016 | Kishi | G09G 3/3241 345/212 |
| 2016/0104422 A1* | 4/2016 | Kishi | G09G 3/3233 345/205 |
| 2016/0155381 A1* | 6/2016 | Kwon | G09G 3/3275 345/215 |
| 2016/0240447 A1* | 8/2016 | Shim | H01L 22/32 |
| 2017/0025081 A1* | 1/2017 | Satoh | G09G 3/3648 |
| 2017/0200432 A1* | 7/2017 | Hsu | G09G 5/006 |
| 2017/0365205 A1* | 12/2017 | Kishi | G09G 3/3266 |
| 2018/0005580 A1* | 1/2018 | Kim | G09G 3/006 |
| 2018/0018910 A1* | 1/2018 | Jang | G09G 3/006 |
| 2019/0019441 A1* | 1/2019 | Shin | H04N 17/004 |
| 2019/0213936 A1* | 7/2019 | Cho | G09G 3/006 |
| 2019/0304350 A1* | 10/2019 | Siu | G01R 31/2825 |

* cited by examiner

SOURCE DRIVER

BACKGROUND

Field of the Invention

The invention relates to a display apparatus and more particularly, to a source driver.

Description of Related Art

A high voltage stress (HVS) test is a kind of test method capable of discovering a defect (or a potential defect) in an early period. For example, a test machine may be employed to discover the defect by applying a stress (i.e., a high voltage) to a plurality of pins of an integrated circuit (a test object). Usually, the test machine transmits the high voltage and a reference voltage which have a great voltage difference therebetween to different pads of the integrated circuit (the test object) through a plurality of probes. The number of the probes is consistent with the number of the test pads.

Figure 1:
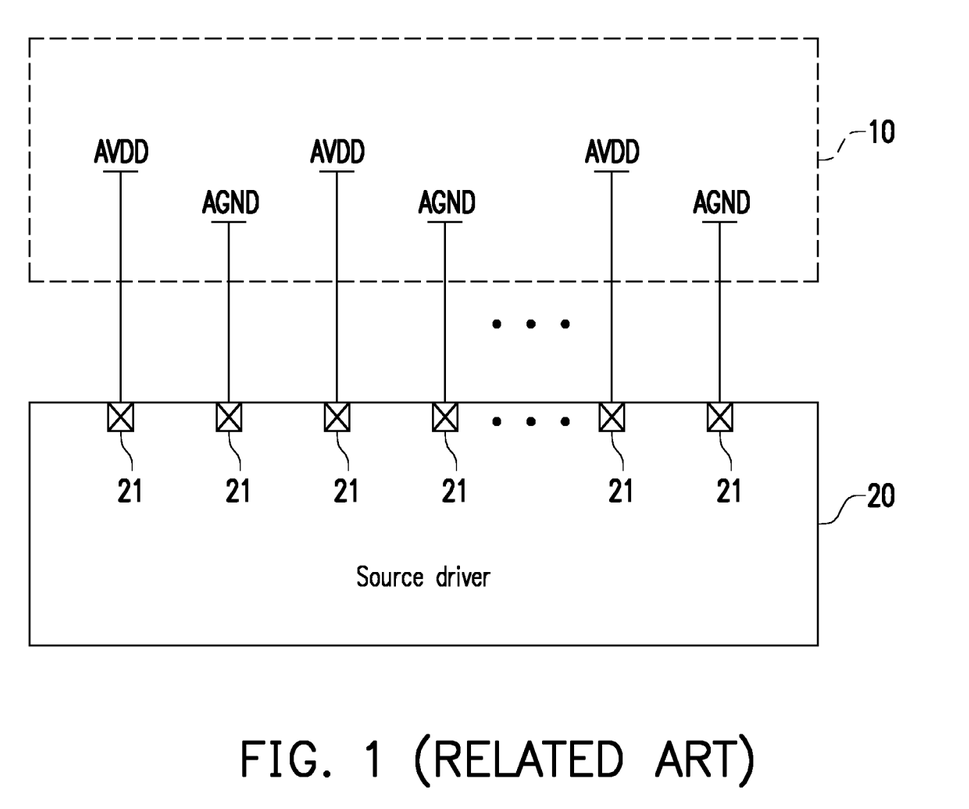
FIG. 1 is a schematic diagram showing a scenario that a high voltage stress test (HVS) is performed on a source driver in the related art.

FIG. 1 is a schematic diagram showing a scenario that a HVS test is performed on a source driver 20 in the related art. The source driver 20 is at least featured in having output pads (or output pins) 21 in a great number. These output pads 21 will be respectively electrically connected to different data lines (or referred to as source lines) of a display panel (not shown). In order to perform the HVS test on these output pads 21, a test machine 10 transmits a test voltage AVDD (i.e., a high voltage) and a test voltage (i.e., a reference voltage) which have a great voltage difference therebetween) respectively to different output pads 21 of the source driver 20 (a test object) through a great number of probes. The greater the number of the output pads of the source driver 20 is, the more probes the test machine 10 needs. Generally speaking, the greater the number of the probes is, the higher the cost of the test machine 10 is.

SUMMARY

The invention provides a source driver capable of performing electrical tests by using charge-sharing paths.

According to an embodiment of the invention, a source drive circuit configured to drive a display panel is provided. The source driver includes a first output pad, a second output pad, a first charge-sharing path, a second charge-sharing path, a first charge-sharing switch, a second charge-sharing switch and a test circuit. The first output pad is configured to be coupled to a first data line of the display panel. The second output pad is disposed next to the first output pad. The second output pad is configured to be coupled to a second data line of the display panel. A first terminal of the first charge-sharing switch is coupled to the first output pad. A second terminal of the first charge-sharing switch is coupled to the first charge-sharing path. A first terminal of the second charge-sharing switch is coupled to the second output pad. A second terminal of the second charge-sharing switch is coupled to the second charge-sharing path. The test circuit is coupled to the first charge-sharing path and the second charge-sharing path. Wherein, the test circuit performs a test for the first output pad and the second output pad via the first charge-sharing path, the second charge-sharing path, the first charge-sharing switch and the second charge-sharing switch in a test period.

To sum up, regarding the source driver provided by the embodiments of the invention, the charge sharing paths thereof can be selectively coupled to the test voltages through the test circuit. By disabling the test circuit, the test voltages do not influence the charge sharing operation of the charge-sharing paths during a charge-sharing period. By enabling the test circuit, the test voltages can be transmitted to the plurality of output pads through the charge-sharing paths, so as to perform the electrical tests on the output pads. Thus, the source driver can perform the electrical tests by using the charge-sharing paths.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The term "couple (or connect)" herein (including the claims) are used broadly and encompass direct and indirect connection or coupling means. For example, if the disclosure describes a first apparatus being coupled (or connected) to a second apparatus, then it should be interpreted that the first apparatus can be directly connected to the second apparatus, or the first apparatus can be indirectly connected to the second apparatus through other devices or by a certain coupling means. Moreover, wherever possible, elements/components/steps with same reference numerals represent same or similar parts in the drawings and embodiments. Elements/components/notations with the same reference numerals in different embodiments may be referenced to the related description.

Figure 2:
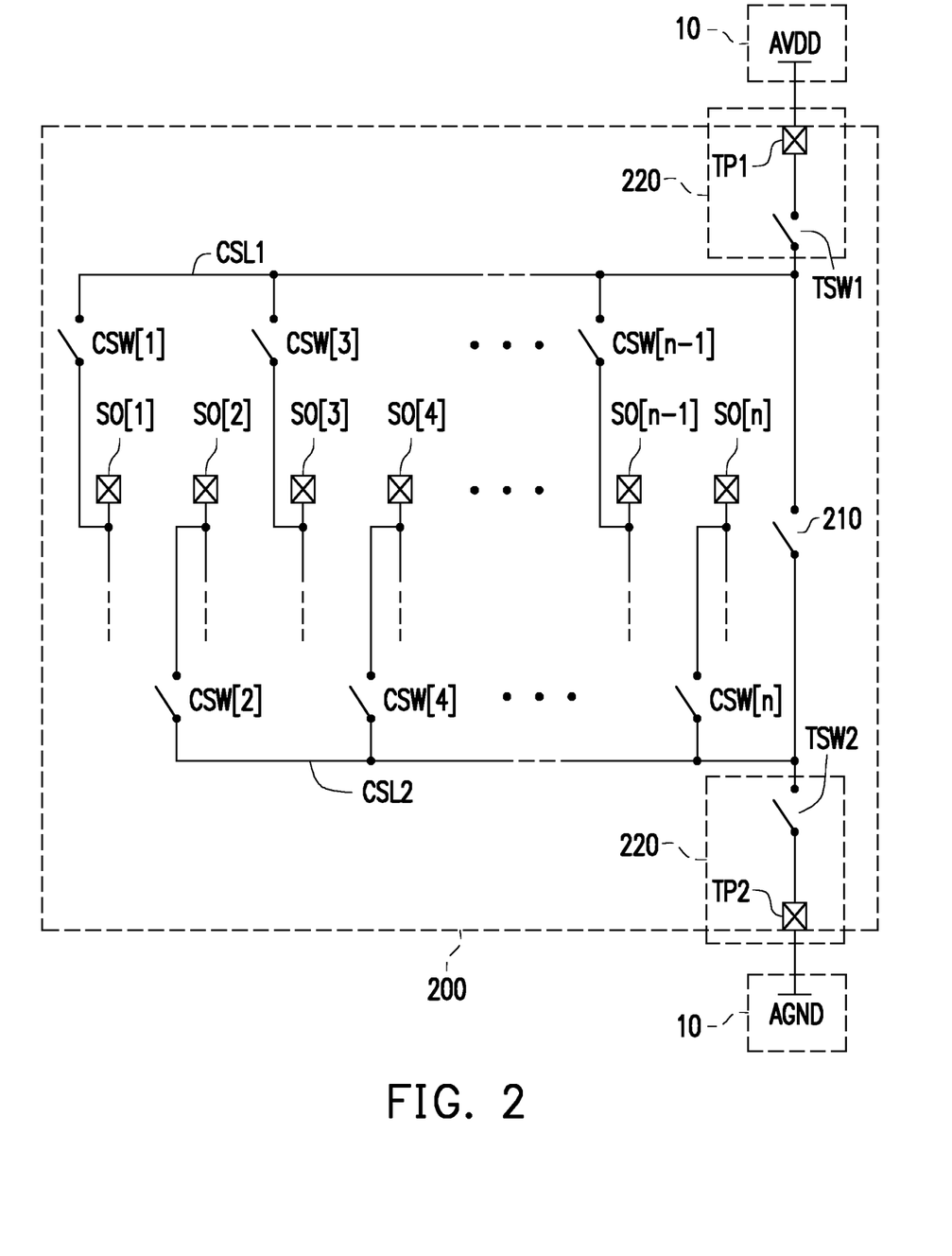
FIG. 2 is a schematic circuit block diagram showing a source driver according to an embodiment of the invention.

FIG. 2 is a schematic circuit block diagram showing a source driver 200 according to an embodiment of the invention. The source driver 200 illustrated in FIG. 2 is configured to drive a display panel (now shown). The source driver 200 has n output pads (or output pins) SO[1], SO[2], SO[3], SO[4], SO[n−1] and SO[n], where n is an integer and may be determined based on a design requirement. These output pads SO[1] to SO[n] are respectively electrically connected to different data lines (or referred to as source lines) of the display panel (not shown). In the source driver 200, the output pads SO[1] to SO[n] are electrically connected to corresponding driving channels (or driving circuits, not shown). When the output pads SO[1] to SO[n] are electrically connected to different data lines of the display panel (not shown), the display panel (not shown) may be driven by the driving channels (not shown) through the output pads SO[1] to SO[n]. The implementation manners of the display panel and the driving channels are not limited in the invention. For example, the display panel may be a conventional display panel or other types of display panels, and the driving channels may be conventional driving channels or other types of driving channels.

In the embodiment illustrated in FIG. 2, the source driver 200 further includes a charge-sharing path CSL1, a charge-sharing path CSL2 and a plurality of charge-sharing switches. n charge-sharing switches CSW[1], CSW[2], CSW[3], CSW[4], CSW[n−1] and CSW[n] are illustrated in the embodiment shown in FIG. 2. A first terminal of the charge-sharing switch CSW[1] is coupled to the output pad SO[1]. A second terminal of the charge-sharing switch CSW[1] is coupled to the charge-sharing path CSL1. The output pad SO[2] is disposed next to the output pad SO[1]. A first terminal of the charge-sharing switch CSW[2] is coupled to the output pad SO[2]. A second terminal of the charge-sharing switch CSW[2] is coupled to the charge-sharing path CSL2. The output pad SO[3] is disposed next to the output pad SO[2]. A first terminal of the charge-sharing switch CSW[3] is coupled to the output pad SO[3]. A second terminal of the charge-sharing switch CSW[3] is coupled to the charge-sharing path CSL1. The output pad SO[4] is disposed next to the output pad SO[3]. A first terminal of the charge-sharing switch CSW[4] is coupled to the output pad SO[4]. A second terminal of the charge-sharing switch CSW[4] is coupled to the charge-sharing path CSL2. In the same way, a first terminal of the charge-sharing switch CSW[n−1] is coupled to the output pad SO[n−1], a second terminal of the charge-sharing switch CSW[n−1] is coupled to the charge-sharing path CSL1, the output pad SO[n] is disposed next to the output pad SO[n−1], a first terminal of the charge-sharing switch CSW[n] is coupled to the output pad SO[n], and a second terminal of the charge-sharing switch CSW[n] is coupled to the charge-sharing path CSL2.

The source drive circuit 200 illustrated in FIG. 2 further includes a short-circuit switch 210. A first terminal of the short-circuit switch 210 is coupled to the charge-sharing path CSL1. A second terminal of the short-circuit switch 210 is coupled to the charge-sharing path CSL2. In a normal operation period, the charge-sharing switches CSW[1] to CSW[n] and the short-circuit switch 210 are turned off. Thus, the charge-sharing paths CSL1 and CSL2 do not influence a driving operation of the driving channels (not shown) of the source driver 200. In a charge-sharing period, the charge-sharing switches CSW[1] to CSW[n] and the short-circuit switch 210 are turned on, and thus, the output pads SO[1] to SO[n] may share charge with one another. The charge sharing operation details are not limited in the present embodiment. For instance, the charge-sharing switches CSW[1] to CSW[n] and the short-circuit switch 210 may perform the conventional charge sharing operations or other charge sharing operations during the charge-sharing period.

According to an actual application demand, in some embodiments, the short-circuit switch 210 may keep being turned-on during the charge sharing period. For instance, when signals of the odd output pads SO[2i−1] (i.e., the out pads SO[1], SO[3], . . . and SO[n−1]) have the same polarity, signals of the even output pads SO[2i] (i.e., the out pads SO[2], SO[4], . . . and SO[n]) have the same polarity, and the polarity of the signals of the odd output pads SO[2i−1] is different from the polarity of the signals of the even output pads SO[2i], the short-circuit switch 210 may keep being turned-on during the charge sharing period.

The source driver 200 illustrated in FIG. 2 further includes a test circuit 220. The test circuit 220 is coupled to the charge-sharing path CSL1 and the charge-sharing path CSL2. The test circuit 220 performs a test for the output pads SO[1] to SO[n] via the charge-sharing path CSL1, the charge-sharing path CSL2 and the charge-sharing switches CSW[1] to CSW[n] in a test period. The test circuit 220 is disabled in a normal operation period and a charge-sharing period. Based on a design requirement, for example, the test includes a high voltage stress (HVS) test, a short-circuit test and/or other electrical tests.

The test circuit 220 illustrated in FIG. 2 includes a test pad TP1, a test pad TP2, a test switch TSW1 and a test switch TSW2. A first terminal of the test switch TSW1 is coupled to the charge-sharing path CSL1. A second terminal of the test switch TSW1 is coupled to a test voltage AVDD. In the embodiment illustrated in FIG. 2, the test pad TP1 is coupled to the second terminal of the test switch TSW1. The second terminal of the test switch TSW1 may receive the test voltage AVDD provided by an external apparatus (for example, a test machine 10) through the test pad TP1. A first terminal of the test switch TSW2 is coupled to the charge-sharing path CSL2. A second terminal of the test switch TSW2 is coupled to a test voltage AGND. In the embodiment illustrated in FIG. 2, the test pad TP2 is coupled to the second terminal of the test switch TSW2. The second terminal of the test switch TSW2 may receive the test voltage AGND provided by the external apparatus (for example, the test machine 10) through the test pad TP2.

In another embodiment, the second terminal of the test switch TSW1 may receive the test voltage AGND provided by the external apparatus (for example, the test machine 10) through the test pad TP1, and the second terminal of the test switch TSW2 may receive the test voltage AVDD provided by the external apparatus (for example, the test machine 10) through the test pad TP2.

Referring to FIG. 2, in some embodiments, in the normal operation period, the test switch TSW1, the test switch TSW2, the charge-sharing switches CSW[1] to CSW[n] and the short-circuit switch 210 are turned off. In some other embodiments, in the normal operation period, the test switches TSW1 and TSW2 are turned on, and the charge-sharing switches CSW[1] to CSW[n] and the short-circuit switch 210 are turned off. In the charge-sharing period, the charge-sharing switches CSW[1] to CSW[n] and the short-circuit switch 210 are turned on, and the test switches TSW1 and TSW2 are turned off. Thus, the test pads TP1 and TP2 do not influence the charge sharing operation of the charge-sharing paths CSL1 and CSL2 during the charge-sharing period.

In a test period, the charge-sharing switches CSW[1] to CSW[n] and the test switches TSW1 and TSW2 are turned on, and the short-circuit switch 210 is turned off. In order to perform a high voltage stress (HVS) test on the output pads SO[1] to SO[n] of the source driver 200, the test machine 10 may transmit the test voltage AVDD (which is a high voltage) to the test pad TP1 of the source driver 200 through a probe and may transmit the test voltage AGND (which is a reference voltage) to the test pad TP2 of the source driver 200 through another probe. Thus, during the test period, the test voltages AVDD and AGND are respectively transmitted to different output pads SO[1] to SO[n], so as to perform the HVS test on these output pads SO[1] to SO[n]. The operation details related to the HVS test are not limited in the present embodiment. Levels of the test voltages which are applied in the HVS test may be determined based on design requirements and/or test standards.

Thus, the source driver 200 may perform the charge sharing operation on the output pads SO[1] to SO[n] by using the charge-sharing paths CSL1 and CSL2 during the charge sharing period and perform the HVS test on the output pads SO[1] to SO[n] by using the charge-sharing paths CSL1 and CSL2 during the test period. By being compared with the conventional source driver 200 illustrated in FIG. 1, the test machine 10 may achieve performing the HVS test on the output pads SO[1] to SO[n] of the source driver 200 illustrated in FIG. 2 by using only two probes. Thus, test cost of the test machine 10 may be reduced.

Figure 3:
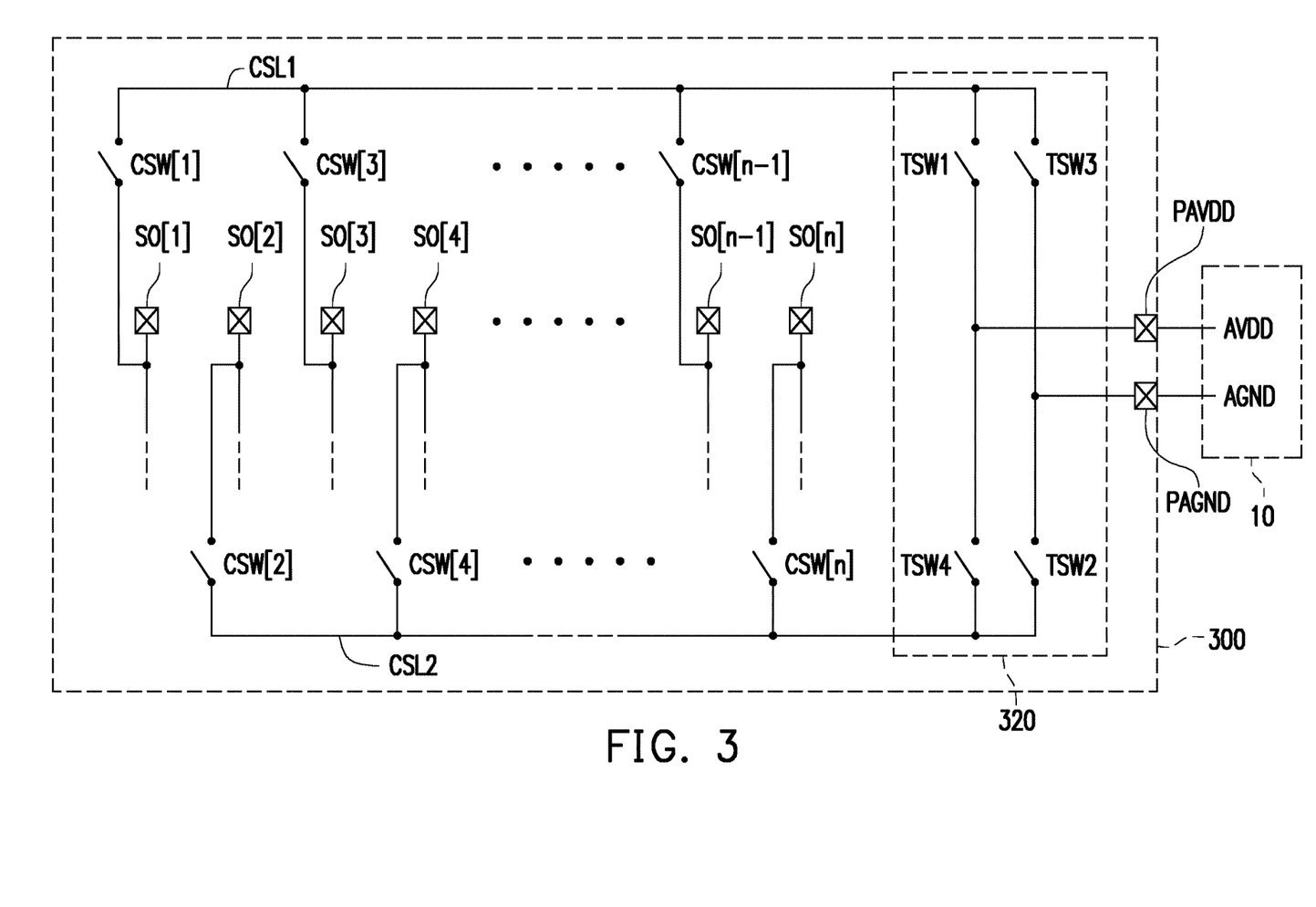
FIG. 3 is a schematic circuit block diagram showing a source driver according to another embodiment of the invention.

FIG. 3 is a schematic circuit block diagram showing a source driver 300 according to another embodiment of the invention. The source driver 300 illustrated in FIG. 3 includes output pads SO[1] to SO[n], a charge-sharing path CSL1, a charge-sharing path CSL2, charge-sharing switches CSW[1] to CSW[n] and a test circuit 320. The output pads SO[1] to SO[n], the charge-sharing path CSL1, the charge-sharing path CSL2, the charge-sharing switches CSW[1] to CSW[n] and the test circuit 320 illustrated in FIG. 3 may be inferred with reference to the descriptions related to the output pads SO[1] to SO[n], the charge-sharing path CSL1, the charge-sharing path CSL2, the charge-sharing switches CSW[1] to CSW[n] and the test circuit 220 illustrated in FIG. 2 and thus, will not be repeated.

In the embodiment illustrated in FIG. 3, the test circuit 320 includes a test switch TSW1, a test switch TSW2, a test switch TSW3 and a test switch TSW4. The source driver 300 further includes an internal power pad PAVDD and an internal ground pad PAGND. A first terminal of the test switch TSW1 and a first terminal of the test switch TSW3 are coupled to the charge-sharing path CSL1, and a first terminal of the test switch TSW2 and a first terminal of the test switch TSW4 are coupled to the charge-sharing path CSL2. A second terminal of the test switch TSW2 and a second terminal of the test switch TSW3 are coupled to an internal ground pad PAGND for receiving the test voltage AGND provided by an external apparatus (for example, the test machine 10). A second terminal of the test switch TSW1 and a second terminal of the test switch TSW4 are coupled to an internal power pad PAVDD for receiving the test voltage AVDD provided by the external apparatus (for example, the test machine 10).

Referring to FIG. 3, in some embodiments, in the normal operation period, the test switches TSW1, TSW2, TSW3 and TSW4 and the charge-sharing switches CSW[1] to CSW[n] are turned off. In some other embodiments, in the normal operation period, the test switches TSW1, TSW2, TSW3 and TSW4 are turned on, and the charge-sharing switches CSW[1] to CSW[n] are turned off. In the charge-sharing period, the charge-sharing switches CSW[1] to CSW[n] are turned on, and the test switches TSW1, TSW2, TSW3 and TSW4 are turned off. In the embodiment illustrated in FIG. 3, the test period includes a first HVS test period and a second HVS test period. In the first HVS test period, the charge-sharing switches CSW[1] to CSW[n] and the test switches TSW1 and TSW2 are turned on, and the test switches TSW3 and TSW4 are turned off. Thus, the test voltage VADD may be transmitted to the odd output pads SO[2$i$−1] (i.e., the out pads SO[1], SO[3], . . . and SO[n−1]), and the test voltage VGND may be transmitted to the even output pads SO[2$i$] (i.e., the out pads SO[2], SO[4], . . . and SO[n]). In the second HVS test period, the test switches TSW1 and TSW2 are turned off, and the charge-sharing switches CSW[1] to CSW[n] and the test switches TSW3 and TSW4 are turned on. Thus, the test voltage VADD may be transmitted to the even output pads SO[2$i$], and the test voltage VGND may be transmitted to the odd output pads SO[2$i$−1].

Figure 4:
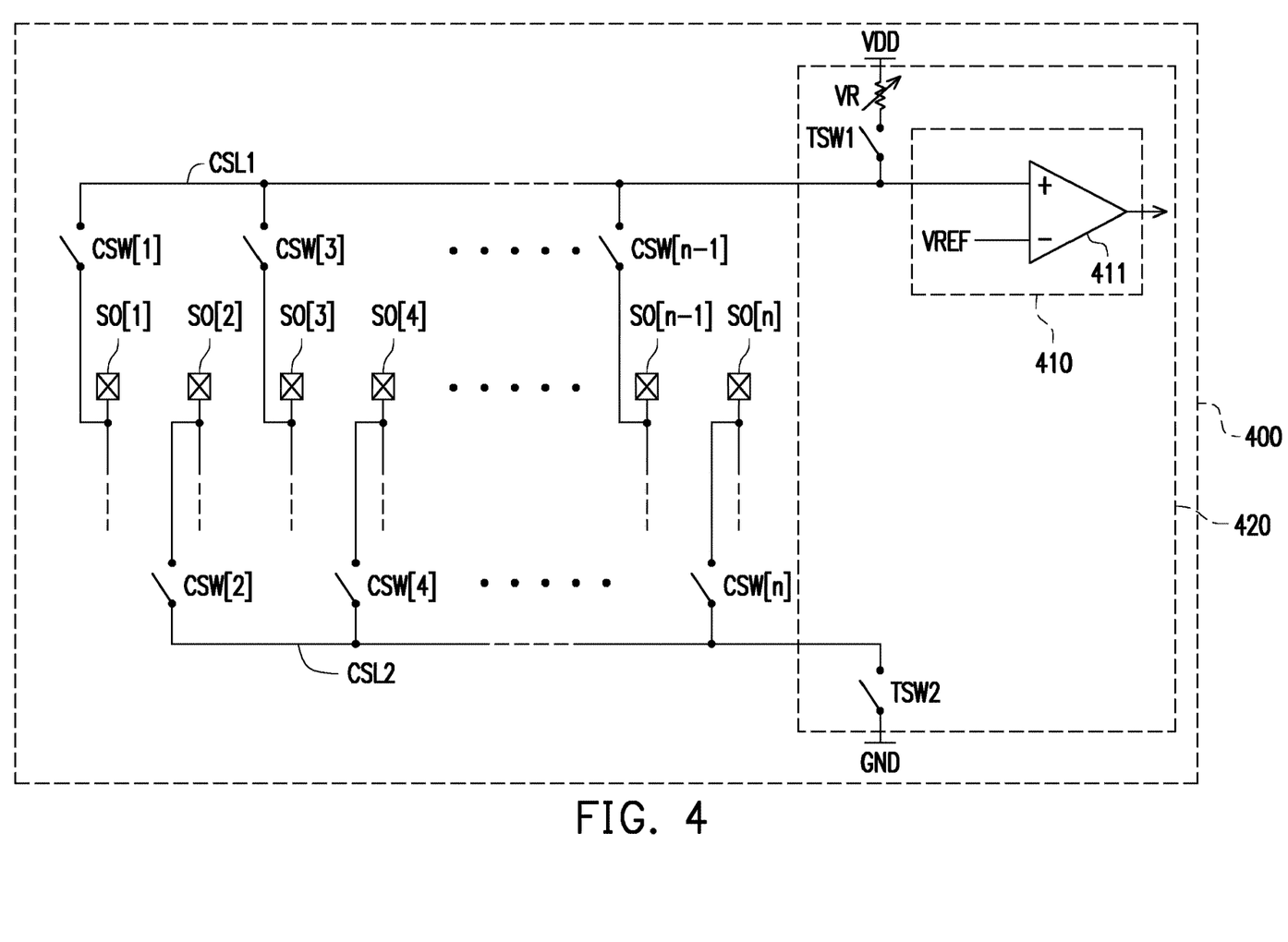
FIG. 4 is a schematic circuit block diagram showing a source driver according to yet another embodiment of the invention.

FIG. 4 is a schematic circuit block diagram showing a source driver 400 according to yet another embodiment of the invention. The source driver 400 illustrated in FIG. 4 includes output pads SO[1] to SO[n], a charge-sharing path CSL1, a charge-sharing path CSL2, charge-sharing switches CSW[1] to CSW[n] and a test circuit 420. In the embodiment illustrated in FIG. 4, the test circuit 420 includes a test switch TSW1, a test switch TSW2, a test resistor VR and a voltage detection circuit 410. The output pads SO[1] to SO[n], the charge-sharing path CSL1, the charge-sharing path CSL2, the charge-sharing switches CSW[1] to CSW[n], test circuit 420, the test switch TSW1 and the test switch TSW2 illustrated in FIG. 4 may be inferred with reference to the descriptions related to the output pads SO[1] to SO[n], the charge-sharing path CSL1, the charge-sharing path CSL2, the charge-sharing switches CSW[1] to CSW[n], test circuit 220, the test switch TSW1 and the test switch TSW2 illustrated in FIG. 2 and thus, will not be repeated.

The source driver 400 further includes power rails VDD and GND. The power rails VDD and GND inside the source driver 400 may provide power to electronic components inside the source driver 400. In the embodiment illustrated in FIG. 4, a first terminal of the test resistor VR is coupled to a second terminal of the test switch TSW1. A second terminal of the test resistor VR is coupled to the power rail VDD. Thus, the second terminal of the test switch TSW1 may receive a first test voltage (e.g. a system voltage) through the test resistor VR and the power rail VDD. An input terminal of the voltage detection circuit 410 is coupled to the charge-sharing path CSL1. In the embodiment illustrated in FIG. 4, the test period includes an output short-circuit detection period. The voltage detection circuit 410 may detect a voltage of the charge-sharing path CSL1 in the output short-circuit detection period. A second terminal of the test switch TSW2 is coupled to the power rail GND inside the source driver 400. The second terminal of the test switch TSW2 may receive a second test voltage (e.g. a ground voltage or other reference voltage) through the power rail GND.

In some embodiments, in the normal operation period, the test switches TSW1 and TSW2 and the charge-sharing switches CSW[1] to CSW[n] are turned off. In some other embodiments, in the normal operation period, the test switches TSW1 and TSW2 are turned on, and the charge-sharing switches CSW[1] to CSW[n] are turned off. In the charge-sharing period, the charge-sharing switches CSW[1] to CSW[n] are turned on, and the test switches TSW1 and TSW2 are turned off. Thus, the power rails VDD and GND do not influence the charge sharing operation of the charge-sharing paths CSL1 and CSL2 during the charge-sharing period.

In the embodiment illustrated in FIG. 4, the test period includes the output short-circuit detection period. In the output short-circuit detection period, the charge-sharing switches CSW[1] to CSW[n] and the test switches TSW1 and TSW2 are turned on. Thus, the electric energy of the power rail VDD may be transmitted to the odd output pads SO[2$i$−1] (i.e., the out pads SO[1], SO[3], . . . and SO[n−1]), and the electric energy of the power rail GND may be transmitted to the even output pads SO[2$i$] (i.e., the out pads SO[2], SO[4], . . . and SO[n]). The voltage detection circuit 410 may detect the voltage of the charge-sharing path CSL1 in the output short-circuit detection period. In a condition that no short-circuit occurs to the output pads SO[1] to SO[n], there is a small leakage current, and thus, the voltage detection circuit 410 may detect that the charge-sharing path CSL1 has a high voltage level in the output short-circuit detection period. In a condition that a short-circuit occurs between any two of the output pads SO[1] to SO[n], there is a large leakage current, and thus, the voltage detection circuit 410 may detect that the charge-sharing path CSL1 has a low voltage level in the output short-circuit detection period.

Based on a design requirement, the output short-circuit detection period may be any time period within a non-display driving period (i.e., a period in which the display panel is not driven by the output pads SO[1] to SO[n]). For example, the output short-circuit detection period may be within a vertical blanking period and/or an initial stage (an initialization period) of the power-on of the source driver 400.

The implementation manner of the voltage detection circuit 410 is not limited in the present embodiment. For example, the voltage detection circuit 410 may include a voltage comparator 411. A first input terminal (for example, a non-inverting input terminal) of the voltage comparator 411 is coupled to the charge-sharing path CSL1. A second input terminal (for example, an inverting input terminal) of the voltage comparator 411 is coupled to a reference voltage VREF. A level of the reference voltage VREF and a resistance of the test resistor VR may be determined based on a design requirement. In the condition that no short-circuit occurs to the output pads SO[1] to SO[n], the leakage current (or the current flowing through the test resistor VR) is small, and thus, the voltage detection circuit 411 may detect that the voltage level of the charge-sharing path CSL1 is higher than the voltage level of the reference voltage VREF in the output short-circuit detection period. In the condition that the short-circuit occurs between any two of the output pads SO[1] to SO[n], the leakage current (or the current flowing through the test resistor VR) is large, and thus, the voltage detection circuit 411 may detect that the voltage level of the charge-sharing path CSL1 is lower than the voltage level of the reference voltage VREF in the output short-circuit detection period.

Based on the above, regarding the source driver provided by the embodiments of the invention, the charge sharing paths thereof can be selectively coupled to the test voltages through the test switches. By turning off the test switches, the test voltages do not influence the charge sharing operation of the charge-sharing paths during the charge-sharing period. By turning on the test switches, the test voltages can be transmitted to the plurality of output pads through the charge-sharing paths during the test period, so as to perform the electrical tests (for example, the HVS test, the short-circuit test or other electrical tests) on the output pads. Thus, the source driver can perform the charge sharing and the electrical test operations by using the charge-sharing paths.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A source driver, configured to drive a display panel, comprising:
   a first output pad, configured to be coupled to a first data line of the display panel;
   a second output pad, disposed next to the first output pad, and configured to be coupled to a second data line of the display panel;
   a first charge-sharing path;
   a second charge-sharing path;
   a first charge-sharing switch, having a first terminal coupled to the first output pad and a second terminal coupled to the first charge-sharing path;
   a second charge-sharing switch, having a first terminal coupled to the second output pad and a second terminal coupled to the second charge-sharing path; and
   a test circuit, coupled to the first charge-sharing path and the second charge-sharing path, wherein the test circuit performs a test for the first output pad and the second output pad via the first charge-sharing path, the second charge-sharing path, the first charge-sharing switch and the second charge-sharing switch in a test period,
   wherein the test circuit comprises:
   a first test switch, having a first terminal coupled to the first charge-sharing path, and a second terminal configured to be coupled to a first test voltage;
   a second test switch, having a first terminal coupled to the second charge-sharing path, and a second terminal configured to be coupled to a second test voltage;
   a first test bad, coupled to the second terminal of the first test switch, wherein the second terminal of the first test switch receives the first test voltage provided by an external device through the first test pad; and
   a second test pad, coupled to the second terminal of the second test switch, wherein the second terminal of the second test switch receives the second test voltage provided by the external device through the second test pad.

2. The source driver according to claim 1, wherein the test circuit is disabled in a normal operation period and a charge-sharing period.

3. The source driver according to claim 1, wherein the test comprises a high voltage stress test or a short-circuit test.

4. The source driver according to claim 1, further comprising:
   a short-circuit switch, having a first terminal coupled to the first charge-sharing path and a second terminal coupled to the second charge-sharing path.

5. The source driver according to claim 1, further comprising:
   a third output pad, configured to be coupled to a third data line of the display panel, wherein the second output pad is disposed between the first output pad and the third output pad;
   a fourth output pad, configured to be coupled to a fourth data line of the display panel, wherein the third output pad is disposed between the second output pad and the fourth output pad;
   a third charge-sharing switch, having a first terminal coupled to the third output pad and a second terminal coupled to the first charge-sharing path; and
   a fourth charge-sharing switch, having a first terminal coupled to the fourth output pad and a second terminal coupled to the second charge-sharing path.

6. The source driver according to claim 1, wherein
   in a normal operation period, the first charge-sharing switch and the second charge-sharing switch are turned off;
   in a charge-sharing period, the first charge-sharing switch and the second charge-sharing switch are turned on, and the first test switch and the second test switch are turned off; and
   in the test period, the first charge-sharing switch, the second charge-sharing switch, the first test switch and the second test switch are turned on.

7. The source driver according to claim 1, wherein the source driver further comprises an internal power pad and an internal ground pad, and the test circuit further comprising:
- a third test switch, having a first terminal coupled to the first charge-sharing path, and a second terminal coupled to the internal ground pad for receiving the second test voltage provided by an external device; and
- a fourth test switch, having a first terminal coupled to the second charge-sharing path, and a second terminal coupled to the internal power pad for receiving the first test voltage provided by the external device,
- wherein the second terminal of the first test switch is coupled to the internal power pad for receiving the first test voltage, and the second terminal of the second test switch is coupled to the internal ground pad for receiving the second test voltage.

8. The source driver according to claim 7, wherein
- in a charge-sharing period, the first test switch, the second test switch, the third test switch and the fourth test switch are turned off;
- in a first high voltage stress test period of the test period, the first test switch and the second test switch are turned on, and the third test switch and the fourth test switch are turned off; and
- in a second high voltage stress test period of the test period, the first test switch and the second test switch are turned off, and the third test switch and the fourth test switch are turned on.

9. The source driver according to claim 1, wherein the source driver further comprises a first power rail and a second power rail, the second power rail is coupled to the second terminal of the second test switch, the second terminal of the second test switch receives the second test voltage through the second power rail, and the test circuit further comprises:
- a test resistor, having a first terminal coupled to the second terminal of the first test switch and a second terminal coupled to the first power rail, wherein the second terminal of the first test switch receives the first test voltage through the test resistor and the first power rail; and
- a voltage detection circuit, coupled to the first charge-sharing path, and configured to detect a voltage of the first charge-sharing path in an output short-circuit detection period,
- wherein the first test switch and the second test switch are turned on in the output short-circuit detection period of the test period.

10. The source driver according to claim 9, wherein the output short-circuit detection period is within a vertical blanking period.

11. The source driver according to claim 9, wherein the voltage detection circuit comprises:
- a voltage comparator, having a first input terminal coupled to the first charge-sharing path and a second input terminal coupled to a reference voltage.

\* \* \* \* \*